(12) United States Patent
Rannou et al.

(10) Patent No.: US 8,758,508 B2
(45) Date of Patent: Jun. 24, 2014

(54) FORMATION OF A THIN FILM OF MOLECULAR ORGANIC SEMICONDUCTOR MATERIAL

(75) Inventors: Patrice Rannou, Isere (FR); Benjamin Grevin, Isere (FR)

(73) Assignees: Centre National de la Recherche Scientifique (CNRS), Paris (FR); Commissariat a l'Energie Atomique et aux Energies Alternatives, Paris (FR)

( * ) Notice: Subject to any disclaimer, the term of this patent is extended or adjusted under 35 U.S.C. 154(b) by 984 days.

(21) Appl. No.: 12/739,378

(22) PCT Filed: Oct. 24, 2008

(86) PCT No.: PCT/EP2008/064476
§ 371 (c)(1),
(2), (4) Date: Apr. 22, 2010

(87) PCT Pub. No.: WO2009/053473
PCT Pub. Date: Apr. 30, 2009

(65) Prior Publication Data
US 2011/0139063 A1 Jun. 16, 2011

(30) Foreign Application Priority Data
Oct. 24, 2007 (FR) ...................................... 07 07452

(51) Int. Cl.
*C30B 29/58* (2006.01)
(52) U.S. Cl.
USPC .................. 117/54; 117/56; 117/35; 117/935
(58) Field of Classification Search
USPC ........................................ 117/54, 56, 35, 935
See application file for complete search history.

(56) References Cited

U.S. PATENT DOCUMENTS 6,608,205 B1   8/2003   Leyderman et al.

2005/0019976 A1*  1/2005  Xiao et al. ...................... 438/99

(Continued)

FOREIGN PATENT DOCUMENTS

WO    WO 2005/104265 A1    11/2005

OTHER PUBLICATIONS

Kena-Cohen, S., et al., "Strong Exciton-Photon Coupling in an Organic Single Crystal Microcavity," Physical Review Letters, 101, (2008) pp. 116401-1-116401-4.

Laudise, R.A., et al, "Growth of a ∝-hexathienyl by a micro melt technique," Journal of Crystal Growth, vol. 152, No. 3 (Jul. 1995) pp. 241-244.

(Continued)

*Primary Examiner* — Bob M Kunemund
(74) *Attorney, Agent, or Firm* — Blakely Sokoloff Taylor & Zafman

(57) ABSTRACT

The invention relates to a method for forming a thin film of molecular organic semiconductor material (OSCM), said film being intended to be integrated into a device for applications in electronics or optoelectronics, which includes the following steps: step (c) of supplying a defined quantity of the molecular OSCM in the form of a melt to the surface of a substrate so as to form a thin film; and a step (d) of cooling according to a defined temperature profile in order to solidify the thin film, characterized in that the temperature of the substrate surface is equal to or above the melting point of the molecular OSCM at the moment of implementing step (a) and in that the temperature profile of step (b) comprises: a first part corresponding to a sufficiently slow controlled cooling of the molecular OSCM down to a temperature close to the crystallization temperature of the molecular OSCM, so as to cause only a single seed to appear in the thin film in melt form; and a second part corresponding to controlled cooling so that at least one single-crystal domain grows from this seed, the thin film finally obtained being a single-crystal film. The invention further relates to a method of forming an organic field-effect transistor.

11 Claims, 5 Drawing Sheets

(56) References Cited

U.S. PATENT DOCUMENTS

2005/0279996 A1* 12/2005 Takubo et al. .................. 257/40
2007/0117298 A1   5/2007 Fujimori et al.
2012/0193618 A1*  8/2012 Takeya et al. .................. 257/40

OTHER PUBLICATIONS

Stingelin-Stutzmatin, N., "Organic thin-film electronics from vitreous solution-processed rubrene hypereutectics," Nature Materials, vol. 4 (Aug. 2005) pp. 601-606.

* cited by examiner

FORMATION OF A THIN FILM OF MOLECULAR ORGANIC SEMICONDUCTOR MATERIAL

The present patent application is a national phase application of International Application No. PCT/EP2008/064476, filed Oct. 24, 2008.

The invention concerns a method to form a thin film of molecular organic semiconductor material (OSCM), said film being intended to be integrated into a device for application in electronics or optoelectronics, so that said material has a desired structural organization (between the amorphous state and the crystalline state) promoting said applications.

Organic semiconductors (pi-conjugated molecules and macromolecules) have been used since the mid-80s as active layers for the forming of various electronic components such as diodes (e.g. organic light emitting diodes OLEDS; polymer light-emitting diodes PLEDS), field effect transistors (e.g. organic field effect transistors OFETs; polymer organic field effect transistors PFETs; single crystal organic field effect transistors SCOFETs), organic photovoltaic cells or organic lasers.

It is known to form said OSCM thin films via wet process i.e. the material is used in a solvent (solution, dispersion, ink, etc.).

This technique, given particular use for polymer semiconductors, does not however allow thin films of single-crystal OSCMs to be obtained.

Also, the use of a solvent may lead to inherent problems of toxicity, volatility and inflammability, and contamination.

It is also known to form thin films of said materials using vacuum evaporation techniques.

These techniques can only be used for vaporizable semiconductor molecules—which is not the case for example with most polymers, and which are relatively small—which is not the case for example with molecules of complex conformations. In particular, the evaporation conditions of some molecules to obtain crystal domains lie at the dewetting limit of these molecules on a given substrate. This is the case for example with the molecular OSCM 5,6,11,12-tetraphenyl-naphtacene, also called rubrene.

In addition, evaporation techniques require large vacuums, which is restricting and costly.

Additionally even if the thin films of some OSCMs by evaporation can be better structured than films obtained by wet process, it generally remains very difficult, even exceptional, to obtain single-crystal thin films on a large scale and without massive loss of material.

This same problem is also raised when preparing thin films by wet process.

Also, another problem encountered by these prior art techniques is the difficulty in accurately controlling the extent of structural organization finally obtained.

Yet, control over the structural quality of these thin films is a key point which governs the electron transport properties and performance levels of the devices.

From WO 2005/104265 and from "Organic thin-film electronics from vitreous solution-processed rubrene hypereutectics" (N. Stingelin-Stutzmann et al, in Nature Materials, Vol. 4, August 2005), it is also known to form a thin film comprising a poly-crystalline OSCM first by melting a composition containing the OSCM in particular, then cooling this liquid composition to cause solidification of the thin film material in polycrystalline form.

Compared with existing techniques, one objective of the invention is to increase the performance levels of organic electronic and opto-electronic devices by controlling the extent of organization of the active thin films in molecular OSCMs.

A further objective of the invention is to obtain said thin films in controlled and reproducible manner.

A further objective of the invention is to form these thin films on large surface areas (wafers of 200 to 300 mm in diameter).

A further objective of the invention is to form said thin films simply and at low cost, so that the method can be transposed on an industrial scale.

To attain these objectives, according to a first aspect, the invention proposes a method to form a thin film in molecular OSCM intended to be integrated in a device for applications in electronics or opto-electronics, comprising the following steps:

a) providing a determined quantity of molecular OSCM in the form of a melt (e.g. the state of molecular OSCM at a temperature higher than its melting point [Mp]) on the surface of a carrier so as to form a thin film;

b) cooling as per a determined temperature profile to cause solidification of the thin film, characterized in that the temperature of the surface of the carrier is equal to or higher than the melting point of the molecular OSCM when step a) is implemented, and in that the temperature profile at step b) comprises:

a first part corresponding to controlled, sufficiently slow cooling of the molecular OSCM melt down to a temperature close to the crystallization temperature of the molecular OSCM, so as only to allow one single seed to appear in the thin film in melt form, and a second part corresponding to controlled cooling so that at least one single-crystal domain grows from this seed, the thin film finally obtained being single crystalline.

Other optional characteristics of this method are:

this method is conducted in an inert atmosphere;

the method also comprises, before step (a), the providing of said molecular OSCM in solid form, and the heating of this molecular OSCM to a temperature higher than its melting point;

step (b) preferably comprises the application of pressure to the surface of the molten molecular OSCM, so as to distribute it as a thin film over the carrier surface;

step (a) comprises:
the housing of said carrier in the receptacle of an oven;
spreading the molten molecular OSCM over the carrier;
exerting pressure on the molten molecular OSCM for its distribution in a thin film of uniform thickness over the surface of the carrier.

cooling is controlled during step (b) by temperature adjustment means in contact with the thin film, servo-controlled by an oven temperature regulating system;

the molecular OSCM is chosen from among the following families of molecular OSCMs:

a first family consisting of the compounds (3), (4), (5) and (6)

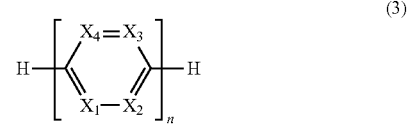

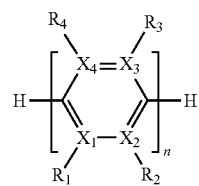

(4)

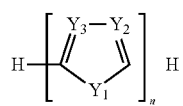

(5)

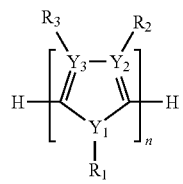

(6)

with n<20 and Mw<5000 g.mol$^{-1}$ (Mw=molecular weight) (advantageously n is an integer between 2 and 20).

with a first pattern [such as (3) and (4)] in which $X_1$=$X_2$=$X_3$=$X_4$=C [or CH for molecule (3)] defining for example biphenyl (n=2), terphenyl (n=3), quaterphenyl (n=4), quinquephenyl (n=5), sexiphenyl (n=6);

with a second pattern [such as (5) and (6)] in which $Y_1$=S, $Y_2$=$Y_3$=C [or CH for molecule (5)] for example defining α-bisthienyl (n=2), α-terthienyl (n=3), α-quaterthienyl (n=4), α-quinquethienyl (n=5), α-sexithienyl (n=6).

For this first family, $R_1$, $R_2$, $R_3$ and $R_4$ are such as defined below and are preferably chosen from among a hydrogen atom, a phenyl, an aralkyl (such as a benzyl) and a straight or branched chain, saturated or unsaturated, containing 1 to 6 carbon atoms.

a second family consisting of compounds (9), (10), (11), (12), (13), (14), (15) and (16)

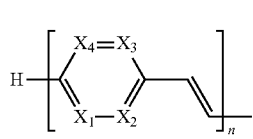

(9)

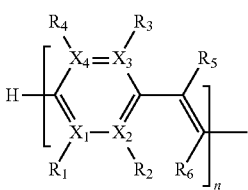

(10)

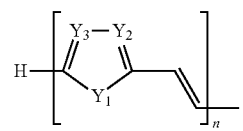

(11)

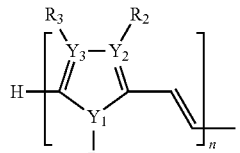

(12)

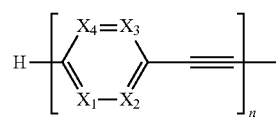

(13)

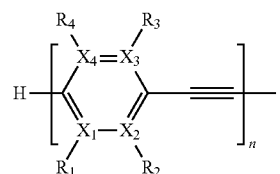

(14)

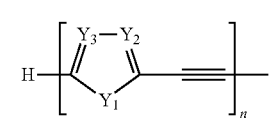

(15)

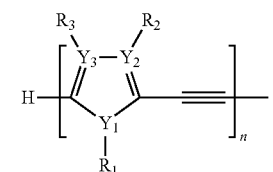

(16)

with n<20 and Mw<5,000 g.mol$^{-1}$ (advantageously n is an integer between 2 and 20)

with a first pattern [such as (9)-(10) and (13)-(14)] in which $X_1$=$X_2$=$X_3$=$X_4$=C [or CH for molecules (9) and (13)] for example defining oligo(1,4-phenylene-vinylene)s or oligo(1,4-phenylene-ethynylene)s depending on the repeat n of the pattern;

with a second pattern [such as (11)-(12) and (15)-(16)] in which $Y_1$=S, $Y_2$=$Y_3$=C [or CH for molecules (11) and (15)] for example defining oligo(2,5-thienylene-vinylene)s and oligo(2,5-thienylene-ethynylene)s.

For this second family, $R_1$, $R_2$, $R_3$ and $R_4$ are such as defined below and are preferably chosen from among a hydrogen atom, a phenyl, an aralkyl (such as a benzyl) and a straight or branched chain, saturated or unsaturated, containing 1 to 6 carbon atoms;

a third family consisting of the compounds (17), (18), (19) and (20)

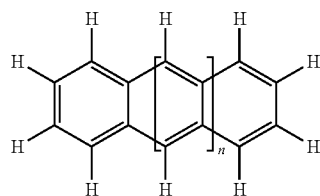

(17)

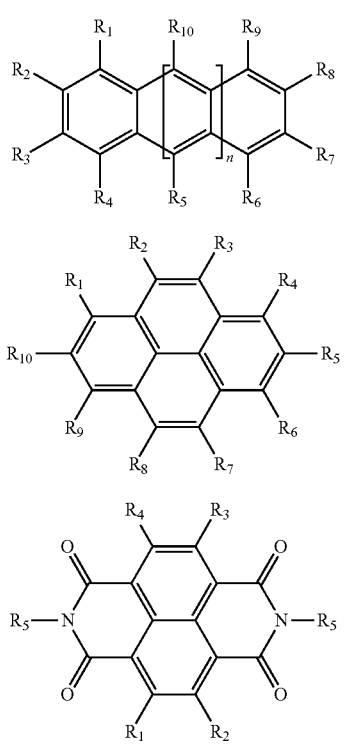

with n<20 and Mw<5000 g.mol$^{-1}$
(advantageously n is an integer between 0 and 20)
- with a first pattern [such as (17)] defining for example naphtalane, anthracene, tetracene, pentacene or hexacene;
- with a second pattern [such as (18)] in which $R_5=R_{10}$=phenyl for example defining 9,10-diphenylanthracene, 5,12-diphenylnaphtacene, or 5,6,11,12-tetraphenylnaphtacene also called rubrene, depending on the repeat n of the pattern;
- with a third pattern [such as (19)] for example defining pyrene, 1,3,6,8-tetraphenylpyrene, 1,3,6,8-tetrathienylpyrene, chrysene, perylene, coronene, terrylene, ovalene, quaterrylene, or $C_{60}$, $C_{70}$, $C_{76}$, $C_{78}$, $C_{84}$ fullerenes;
- with a fourth pattern (of type such as (20)] for example defining the diimides of naphtalene-1,4,5,8-tetracarboxylic acid, diimides of anthracene-2,3,6,7-tetracarboxylic acid, diimides of perylene-3,4,9,10-tetracarboxylic acid, For this third family, the radicals $R_1$ to $R_{10}$ are such as defined below, and are preferably chosen from among a hydrogen atom, a phenyl, an aralkyl (such as a benzyl) and a straight or branched chain, saturated or unsaturated, containing 1 to 6 carbon atoms, the molecular OSCM may also be chosen to comprise:
- aryl groups, namely with the basic pattern M1 (see below) in which $X_1=X_2=X_3=X_4=C$; and/or
- heteroaryl groups comprising the basic pattern M1 in which $X_1$, $X_2$, $X_3$ and $X_4$ are chosen from among C, O, S, N, P and B and preferably are chosen from among C, N and P, and further preferably from among C and N; and/or
- groups of heterocyclic types comprising the basic pattern M2 (see below) in which $Y_1=O$, or S, or N, or P, or B (preferably $Y_1=O$, S or N and advantageously $Y_1=S$) and in which $Y_2$ and $Y_3$ are chosen from among C, O, S, N, P and B and preferably are chosen from among C, N and P and further preferably from among C and N.

According to a second aspect, the invention proposes a method to form an organic field effect transistor, such as an OFET, characterized in that it comprises the following steps:
(a) the providing of a "pre-patterned" substrate, the "pre-patterned" substrate comprising a gate, a gate dielectric, source electrodes and drain electrodes;
(b) forming a thin film in single-crystal molecular OSMC conforming to the method of the invention, the "pre-patterned" substrate being said carrier and the thin film being the active layer of the transistor.

Other characteristics, purposes and advantages of the invention can be read in the following description given as a non-limiting example and illustrated by the following figures.

Figures 1A, 1B, 1C:
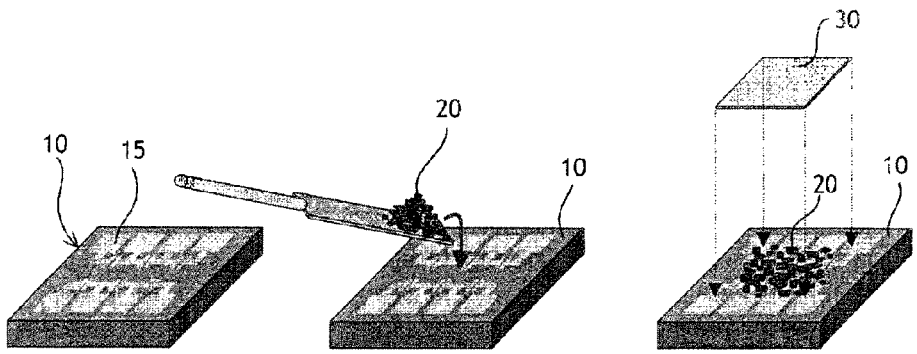
FIGS. 1A to 1F illustrate different steps in a method to form an OFET according to the invention.

The molecular OSCMs used can be in the form of powders of greater or lesser particle size, or in any other solid form.

A molecular OSCM is an OSCM consisting of "small molecules" i.e. having molecular architectures (1D, quasi-1D, 2D and 3D) with a molecular weight (Mw [g.mol$^{-1}$]) equal to or less than around 5,000 g.mol$^{-1}$, comprising a number of repeat units (n) close to 20 and preferably equal to or less than 20 (e.g. oligomers) and having the characteristic of preferably being congruent at the melting point. Organic Semiconductor Polymers (OSCPs: macromolecular architectures in which n>20), Organic Semiconductor Copolymers (OSCCs: macromolecular architectures in which n>20) and Mesomorphous Organic Semiconductor Materials (MOSCMs) are therefore excluded from the field of the invention. The molecular OSCM can be any organic material (i.e. containing at least carbon and several single or double carbon-carbon bonds, preferably hydrogen and carbon-hydrogen bonds) which has semiconductor properties.

For example the molecular OSCM which will comprise the basic patterns M1 and M2, namely:

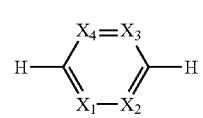

M1 with X1, X2, X3 and X4 = C, or O, or S, or N, or P or B

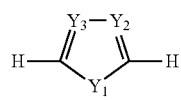

M2 with Y1 = O, or S, or N, or P, or B with Y2 and Y3 = C, or O, or S, or N, or P, or B can be chosen from among the three following families:

Preferably, $X_1$, $X_2$, $X_3$ and $X_4$ are chosen from among C, N and P, and advantageously from C and N.

$Y_2$ and $Y_3$ are advantageously chosen from among C, N and P, and preferably from among C and N.

Family 1 (OSCM with straight architecture containing patterns M1 and M2) illustrated below and comprising 1D/quasi-1D oligomers (3) and (5) and their substituted derivatives (4) and (6) with substituents $R_1$, $R_2$, $R_3$ and $R_4$ such as defined below.

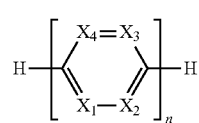
(3)

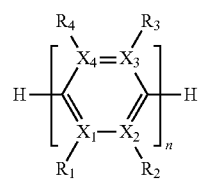
(4)

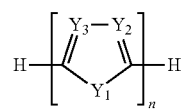
(5)

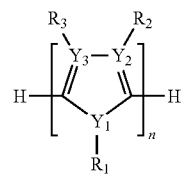
(6)

with n<20 and Mw<5,000 g.mol$^{-1}$ (advantageously n is an integer between 2 and 20)

Family 2 (OSCM with "mixed" straight architecture containing patterns M1 and M2) illustrated below and comprising "mixed" 1D/quasi-1D co-oligomers (9), (11), (13) and (15) and their "mixed" substituted derivatives (10), (12), (14) and (16) with substituents $R_1$, $R_2$, $R_3$ and $R_4$ such as defined below.

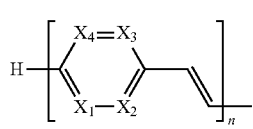
(9)

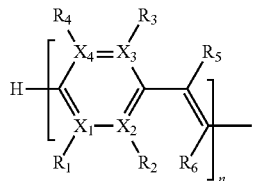
(10)

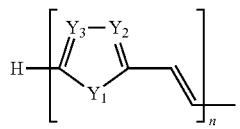
(11)

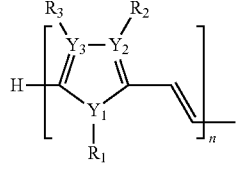
(12)

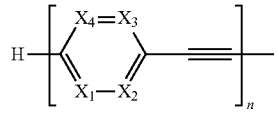
(13)

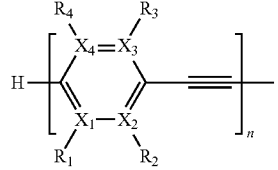
(14)

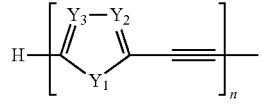
(15)

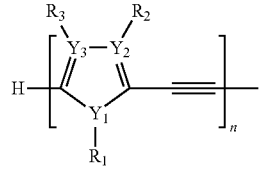
(16)

with n<20 and Mw<5,000 g.mol$^{-1}$ (advantageously n is an integer between 2 and 20)

Family 3 (OSCM with quasi-1D/2D and 2D-3D architectures containing patterns M1 and M2 shown when $X_1\!=\!X_2\!=\!X_3\!=\!X_4\!=\!C$) illustrated below and comprising polycyclic/polyheterocyclic structures (these latter structures are not illustrated here) in fused rings (17) and quasi-1D/2D and their 2D-3D substituted derivatives (18), (19) and (20).

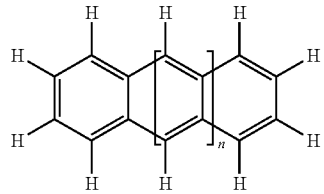
(17)

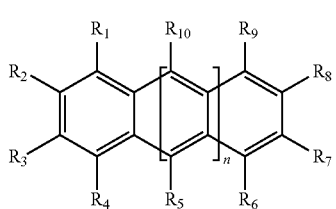

(18)

with n<20 and Mw<5,000 g.mol$^{-1}$

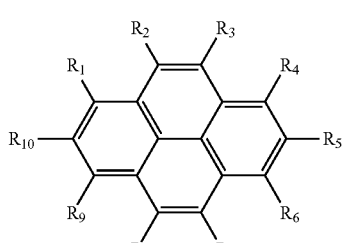

(19)

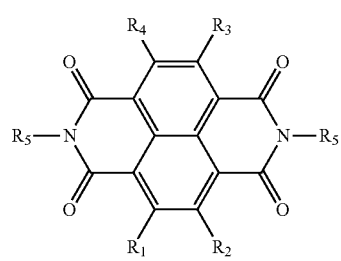

(20)

(advantageously n is an integer between 0 and 20, and $R_1$ to $R_{10}$ are such as defined below).

A molecular OSCM which can be used under the invention may also comprise aryl groups (M1 basic pattern with $X_1$=$X_2$=$X_3$=$X_4$=C) and/or heteroaryl (M1 basic pattern with $X_1$, $X_2$, $X_3$, $X_4$ chosen from among C, O, S, N, P and B, and preferably from among C, N and P and further preferably from among C and N) and/or heterocyclic type (M2 basic pattern with $Y_1$ chosen from among O, S, N, P and B and advantageously from among O, S and N and preferably =S, and $Y_2$ and $Y_3$ chosen from among C, O, S, N, P and B and preferably from among C, N and P, and further preferably chosen from among C and N). Cases in which $X_1$ and/or $X_2$ and/or $X_3$ and/or $X_4$=O and $Y_2$ and/or $Y_3$=O are excluded.

The term aryl here includes fused ring polycyclic components containing at least one fully aromatic ring optionally substituted by one or more groups $R_1$, $R_2$, $R_3$, $R_4$, $R_5$, $R_6$, $R_7$, $R_8$, $R_9$ and $R_{10}$ for example of the type cyano, amino, fluoro, chloro, bromo, iodo, nitro, phenyl, hydroxy, sulfo, $C_{1-20}$ alkyl, $C_{2-20}$ alkenyl, $C_{2-20}$ alkynyl, ester (i.e. —$CO_2$—$R^a$ in which $R^a$ is chosen from among: non-substituted $C_{1-20}$ alkyl, alkenyl or alkynyl; and aralkyl such as defined herein), alkyl ester (i.e. —$R^{b1}$—$CO_2$—$R^{a1}$ in which $R^{a1}$ is such as defined for $R^a$ and $R^{b1}$ is chosen from among: $C_{1-20}$ alkyl, $C_{2-20}$ alkenyl, $C_2$-$C_{20}$ alkynyl; and aralkyl such as defined herein), $C_{1-20}$ alcoxy, amide (i.e. —$CONR^bR^c$ in which $R^b$ and $R^c$ are independently chosen from among: hydrogen; a non-substituted $C_{1-20}$ alkyl, a $C_{2-20}$ alkenyl or a $C_{2-20}$ alkynyl; and aralkyl groups such as defined herein) and alkynylaryl (i.e. —CC-aryl-$R^{c1}$ in which $R^{c1}$ is chosen from among: hydrogen, a non-substituted $C_{1-20}$ alkyl, a $C_{2-20}$ alkenyl or a $C_{2-20}$ alkynyl; and aralkyl groups such as defined herein).

Advantageously, the substituents $R_1$ to $R_{10}$ are chosen independently of each other from among a hydrogen atom, a phenyl, an aralkyl (such as a benzyl) and a straight or branched chain, saturated or unsaturated, containing 1 to 6 carbon atoms.

The term "heteroaryl" as used herein refers to the compounds containing an aromatic or non-aromatic cycle, in fused or non-fused ring, polycyclic and monocyclic, these compounds also containing at least one heteroatom such as nitrogen, sulphur or oxygen or a combination thereof in one of the rings, and in which at least one of the rings is aromatic. The ring or rings comprising the heteroatom may comprise three, four, five, six, seven or eight elements. The term "heteroaryl" is intended to include compounds which comprise saturated rings in full or in part in addition to aromatic rings. The heteroatom may be positioned in the wholly or partly saturated rings or in the aromatic ring.

The term "heteroaralkyl" such as used herein refers to a $C_{1-20}$ alkyl substituted by heteroaryls (e.g. pyrazolylmethyl).

The heteroaryl compounds may optionally be substituted by alkyl, alkaryl groups or aryl groups such as defined above or with one or more of the other groups notably chosen from among cyano, amino, fluoro, chloro, bromo, iodo, nitro, phenyl, hydroxy, sulfo, thiol, ester (i.e. —$CO_2$—$R^d$ in which $R^d$ is chosen from among: a non-substituted $C_{1-6}$ alkyl, an alkenyl or alkynyl; and aralkyl such as defined herein), amide (i.e. —$CONR^eR^f$ in which $R^e$ and $R^f$ are independently chosen from among: hydrogen; a non-substituted $C_{1-6}$ alkyl, a $C_{1-6}$ alkenyl or a $C_{1-6}$ alkynyl; and a $C_{1-6}$ aralkyl such as defined herein).

The term "alkyl" such as used herein, includes a straight chain, and for the alkyl groups containing three or more carbon atoms, branched, and also cycloalkyl groups. Examples of straight chain alkyls include methyl, ethyl, propyl, butyl, pentyl and hexyl. Examples of branched alkyls include isopropyl, isobutyl and tert-butyl. Examples of cycloalkyl groups include cyclopropyl, cyclobutyl, cyclopentyl and cyclohexyl.

Under the invention, the preferred alkyl groups are those having 1 to 20 carbon atoms, and more preferably 2 to 15, and ideally 4 to 12 carbon atoms. If the alkyl group is a methyl, it is preferably substituted with an aryl group and/or a heteroaryl group on these ortho or meta positions. For the alkyl groups containing three or more carbon atoms, the isomers with branched structure are preferred.

The alkyl groups can optionally be substituted for example with aryl groups (such as phenyl) and aralkyl and/or one or more groups such as cyano, amino, fluoro, chloro, bromo, iodo, nitro, hydroxy, sulfo, thiol, ester (namely —$CO_2$—$R^g$ in which $R^g$ is chosen from among: a $C_{1-6}$ alkyl, a $C_{1-6}$ alkenyl or non-substituted $C_{1-6}$ alkynyl; and an aralkyl or an aryl such as defined herein), $C_{1-6}$ alcoxy and amide (i.e. —$CONR^hR^i$ in which $R^h$ and $R^i$ are independently chosen from among: hydrogen; $C_{1-6}$ alkyl, $C_{1-6}$ alkenyl or a non-substituted $C_{1-6}$ alkynyl; and an aralkyl or aryl such as defined herein). Alkyl groups can be substituted in the alkyl chain by one or more heteroatoms chosen from among O, S and N.

The terms "alkenyl" and "alkynyl" are defined in similar manner to the term "alkyl" except that these groups contain at least two carbon atoms and one or more, preferably one, double or triple carbon-carbon bond respectively.

The term "aralkyl" such as used herein refers to alkyls of $C_1$ to $C_{20}$ type substituted with aryl groups (e.g. benzyl).

Preferred examples of OSCMs include polyacenes such as naphtacene, dibenzonaphtacene, tetrabenzonaphtacene, pentacene, hexacene, heptacene, dibenzopentacene, tetrabenzopentacene, pyrene, dibenzopyrene, chrysene, perylene, coronene, terrylene, ovalene, quaterrylene and the derivatives for which some carbon atoms of the polyacenes are substituted with atoms such as N, S and O with a functional group such as a carbonyl group or carboxyl group, for example, diimides of tetracarboxylic acids such as the diimide of naphthalene-1,4,5,8-tetracarboxylic acid and diimides of anthracene-tetracarboxylic acids such as the diimides of anthracene-2,3,6,7-tetracarboxylic acid, fullerenes such as $C_{60}$, $C_{70}$, $C_{76}$, $C_{78}$ and $C_{84}$, carbon nanotubes such as Single-Walled Carbon Nanotubes, SWNTs, and polycyclic condensation products described in more detail in the publication of Japanese patent application no. 11-195790.

Preferred materials are condensed polycyclic aromatic compounds such as naphtacene, dibenzonaphtacene, tetrabenzonaphtacene, fullerenes, the diimides of condensed cyclic tetracarboxylic acids with condensed fused ring compounds and 20-metallophtalocyanines.

According to one embodiment, the organic semiconductor material comprises a polycyclic fused ring system.

The polycyclic fused ring system is optionally substituted with one or more groups chosen from among: an aryl; an alkynylaryl; a $C_{1-20}$ alkyl; a $C_{2-20}$ alkenyl; a $C_{2-20}$ alkynyl; a $C_{1-20}$ aralkyl; a $C_{1-20}$ alcoxy; —CCh—$R^i$ in which $R^i$ is chosen from among: a non-substituted $C_{1-20}$ alkyl, $C_{2-20}$ alkenyl and $C_{2-20}$ alkynyl, said one or more aryl and/or alkynylaryl and/or aralkyl groups optionally being substituted on the aromatic cycle with one or more groups chosen from among: a phenyl; $C_{1-20}$ alkyl; $C_{2-20}$ alkenyl; $C_{1-20}$ aralkyl; $C_{1-20}$ alcoxy; —$CO_2$—$R^k$ in which $R^k$ is chosen from among: a non-substituted $C_{1-20}$ alkyl of $C_{1-20}$ alkenyl and of $C_{2-20}$ alkynyl.

Other optional substituents for the polycyclic fused ring system include the groups cyano, amino, fluoro, chloro, bromo, iodo, nitro, hydroxy, sulfo, thiol and amide (i.e. —$CONR^j R^m$ in which $R^j$ and $R^m$ are independently chosen from among: hydrogen; a non-substituted $C_{1-6}$ alkyl of alkenyl, of alkynyl; an aryl, an aralkyl).

In one embodiment of the invention, the organic semiconductor material comprises a polycyclic fused ring system comprising two to twelve, preferably four to ten, and ideally six to eight aromatic rings in which the aromatic rings are optionally substituted as described herein.

Preferably, the aromatic rings are of $C_6$ type, for example phenyl rings.

In one embodiment, the organic semiconductor material (OSCM) comprises a polycyclic fused ring system having the following formula (18):

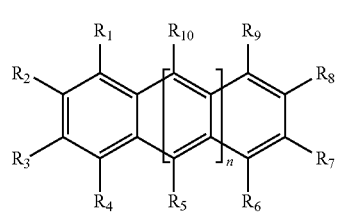

(18)

in which n is an integer between 0 and 20, preferably between 1 and 6; and $R_1$, $R_2$, $R_3$, $R_4$, $R_5$, $R_6$, $R_7$, $R_8$, $R_9$ and $R_{10}$ are independently chosen from the group consisting of: hydrogen; an aryl; an alkynylaryl; $C_{1-20}$ alkyl; a non-substituted alkyl of $C_{1-20}$ and $C_{2-20}$ alkenyl; $C_{2-20}$ alkynyl; $C_{1-20}$ aralkyl; $C_{1-20}$ alcoxy; —$CO_2$—$R^O$ in which $R^O$ is chosen from among: a non-substituted alkyl of $C_{1-20}$ and $C_{2-20}$ alkenyl, of $C_{2-20}$ alkynyl, of $C_{1-20}$ aralkyl or of $C_{1-20}$ alcoxy.

Preferably, $R_5$ and $R_{10}$ are independently chosen from among hydrogen and the aryls, optionally substituted with one or more $C_{1-20}$ alkyl groups, preferably $C_{2-10}$. More particularly, the aryl groups are preferably phenyl groups.

In one embodiment, $R_1$, $R_2$, $R_3$, $R_4$, $R_6$, $R_7$, $R_8$ and $R_9$ are all hydrogen, and $R_5$ and $R_{10}$ are chosen from among hydrogen, an aryl and an alkynylaryl in which the aryl and alkynylaryl groups are optionally substituted with one or more $C_{1-20}$ alkyl groups, preferably $C_{2-10}$. Preferably, $R_5$ and $R_1^o$ are aryls and/or $C_{2-4}$ alkynylaryls. More particularly, the aryl groups are preferably phenyl groups.

If n>1, each group of $R_5$ and $R_{10}$ can be the same or different. Advantageously, the organic semiconductor material is a polycyclic fused ring compound chosen from among: a diphenylanthracene, optionally substituted with one or more $C_{1-20}$ alkyl groups preferably for any position of the non-fused aromatic ring; a hexaphenylnaphtacene optionally substituted with one or more $C_{1-20}$ alkyl groups preferably for any position of the non-fused aromatic ring; a tetraphenylnaphtacene optionally substituted with one or more $C_{1-20}$ alkyl groups preferably for any position of the non-fused aromatic ring; a bis(phenylethynl)naphtacene optionally substituted with one or more $C_{1-20}$ alkyl groups preferably for any position of the non-fused aromatic ring; a hexaphenylpentacene optionally substituted with one or more $C_{1-20}$ alkyl groups preferably for any position of the non-fused aromatic ring; and a diphenylnaphtacene optionally substituted with one or more $C_{1-20}$ alkyl groups preferably for any position of the non-fused aromatic ring. In one preferred embodiment, the alkyl groups are $C_{4-12}$ alkyl groups.

It is preferred that the polycyclic ring compound should be substituted at one to four positions, preferably two to three positions. It is also preferred that the positions should be in non-fused aromatic rings.

In one particularly preferred embodiment, the organic semiconductor material is chosen from among 5,6,11,12-tetraphenylnaphtacene (21) (rubrene), 5,12-diphenylnaphtacene (22) and 9,10-diphenylanthracene (23). These compounds can optionally be substituted with several $C_{1-20}$ alkyl groups, preferably $C_{4-12}$, at each of the positions of the non-fused aromatic ring.

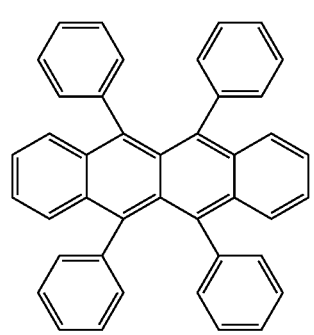

(21)

(22)
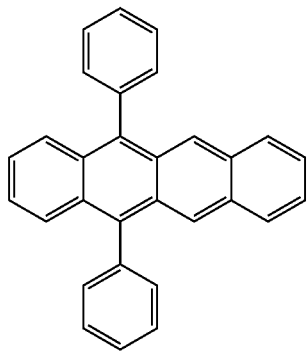

(23)
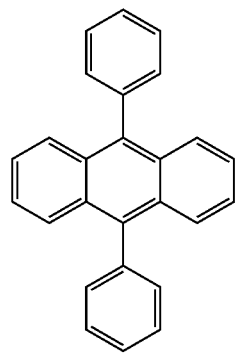

In one embodiment of the invention, the organic semiconductor materials are 5,6,11,12-tetraphenylnaphtacene (rubrene) (21) and 5,11-bis-(4-tert-butylphenyl)-6,12-diphenylnaphtacene (24). The compounds (21) and (23) can be commercially obtained. Alternatively, compound (21) can be synthesized following the method described in F. H. Allen and L. Gilman (J. Am. Chem. Soc. 58 (1936) 937). The synthesis method described in Allen and Gilman can be modified to provide the derivatives described above, using suitable substituted aryl compounds for example instead of non-substituted aryl compounds.

(24)
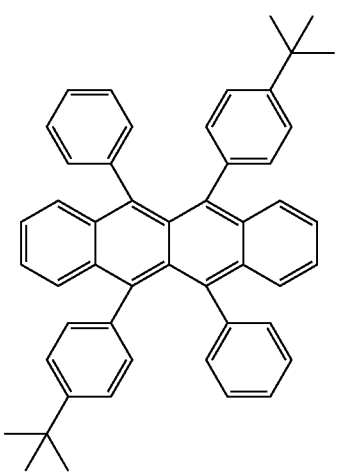

Examples of said preferred substituted compounds are (25), (26) and (27)

(25)
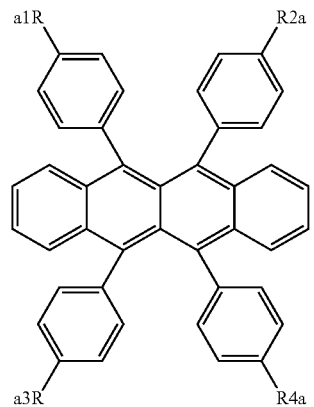

(26)
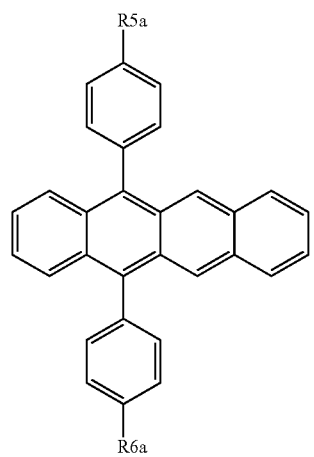

(27)
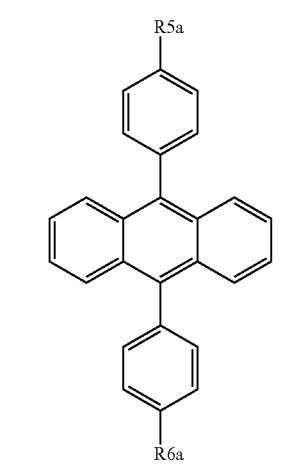

R1a, R2a, R3a, R4a, R5a and R6a are independently chosen from among hydrogen or $C_1$-$_{20}$ alkyl groups. Preferably the alkyl groups are $C_2$-$_{15}$ alkyl groups, more preferably $C_4$-$_{12}$.

According to one first embodiment of the method, the molecular OSCM (in powder form) is placed in a reservoir then transferred to a device ensuring complete melting of the molecular OSCM. A determined quantity of molecular OSCM melt is then transferred to a receptacle device containing a receiver surface for the melt.

According to a second embodiment, the molecular OSCM powders are directly placed on the receiver surface, and are then melted.

The receiver surface can be the upper surface of a "pre-patterned" substrate e.g. an OFET substrate or a gate dielectric surface.

The receiver surface can be treated to modify its wettability with respect to the molecular OSCM. For example, if this surface is an oxide (e.g. $SiO_2$, $Al_2O_3$, $Ta_2O_5$ ...) it can be functionalized by chemisorption of a silanizing agent (e.g. derivatives of the trialcoxychlorosilane family for $SiO_2$).

In all cases, the molecular OSCM is brought to a temperature higher than its melting point (Mp). The receiver surface is advantageously at a temperature higher than the Mp.

Once the thin film of molecular OSCM is in its molten state, a step to control the extent of its structuring is then performed according to the invention.

This control over the extent of structuring is based on knowledge of the phase transitions (melting point (Mp), crystallization temperature (Tc), etc.) of the molecular OSCM used.

With knowledge of this data, the control over the structuring of the thin film in molecular OSCM can be ensured by controlling the rate of cooling of the receiver surface+molecular OSCM assembly.

To obtain an amorphous thin film, annealing may be conducted by rapidly moving from Mp to ambient temperature to fix the disorder of the molecular OSCM melt in the solid state.

On the other hand, to obtain single-crystal thin films, cooling is preferably conducted by controlled lowering of the temperature of the receiver surface+molecular OSCM assembly (kinetics: temperature profile and residence time) down to the region of the crystallization temperature Tc of the OSCM. This temperature lowering rate is chosen to be sufficiently low to cause:
  during a first phase, the onset of a finite number of crystal seeds, even a single crystal seed, then
  during a second phase, progressive growth of single-crystal domains from this finite number of seeds. Control over crystallization is related in particular to the chemical structure of the molecular OSCM and to the cooling protocol;
  optionally, return to ambient temperature of the receiver surface+single-crystal molecular OSCM assembly using a suitable cooling profile.

It is to be noted that this method is preferably conducted in an inert atmosphere (e.g. nitrogen ($N_2$) and/or argon (Ar)) to avoid any decomposition (for example through reactions of oxidation, chemical cross-linking, hydrolysis, etc.) of the molecular OSCM. In this manner, chemical stability can be obtained together with molecular OSCM integrity.

Intermediate structural organizations between the amorphous state and the single-crystal state can be obtained by using intermediate temperature profiles between annealing and crystallization.

A thin film having a desired structural organization is thus obtained.

Finally, the thin film of molecular OSCM carried by the receiver surface or substrate is taken out of the receptacle.

With reference to FIGS. 1A to 1F, different steps of a particular method are illustrated to fabricate a component comprising a thin film in single-crystal molecular OSCM according to the invention.

It is to be noted that this method has been tested and validated by the inventors.

With reference to FIG. 1A, a pre-patterned substrate 10 is provided. This substrate can be pre-patterned to comprise one or more components 15. For example, each component 15 has a structure of transistor type fabricated from a doped silicon substrate (back gate contact) on which a silicon oxide layer ($SiO_2$, gate insulator) has been formed by thermal process and on which contacts (source and drain) in Ti/Au have been evaporated. It is therefore a "back gate" configuration with "bottom contacts" (the source-drain gap distances being in the order of 4 microns to a few tens of microns).

This substrate 10 is then housed in a receptacle.

The whole is placed in an oven for example a multi-zone oven with heating by induction, or microwave or electric current.

This oven is also provided with mechanical pressing means able to compel the content of the receptacle (i.e. the substrate 10) in a vertical direction—the receptacle being in a horizontal position.

With reference to FIG. 1B, a molecular OSCM is arranged in powder form (e.g. a powder 20 with more or less fine particle size) for example at ambient temperature.

Figures 1D, 1E, 1F:
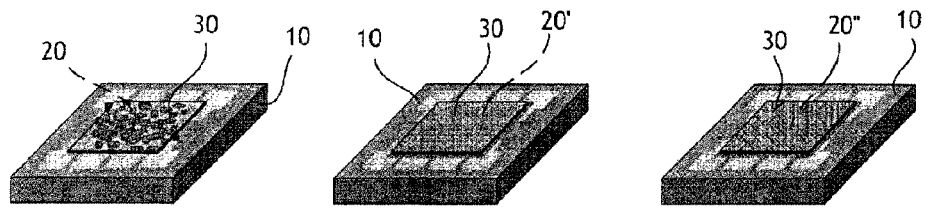

With reference to FIGS. 1C and 1D, said mechanical pressing means force the powder 20 against the substrate 10 under pressure.

Here, the end part of the pressing means is illustrated by a thin plate 30 in glass for example which comes into contact with the powder 20.

With reference to FIG. 1E, heat treatment in a neutral gas (e.g. $N_2$ and/or Ar) is conducted in the oven, to bring the temperature to the Mp of the molecular OSCM. The molecular OSCM then changes to its melt state 20'.

With reference to FIG. 1F, cooling to ambient temperature is carried out following an adapted temperature profile according to the invention, down to the Tc of the molecular OSCM to obtain a single-crystal thin film 20" whose structural organization is controlled.

To control the temperature profile, the plate 30 may contain servo-controlled temperature regulating systems. It is possible for example to act on the temperature of the molecular OSCM by adjusting the temperature of this plate 30 in relation, for example, to temperature measurements made in the oven. With these means, the temperature and cooling rate of the molecular OSCM 20' can be controlled with accuracy.

In this example, it is an organic electronic device of OFET type having as active layer the single-crystal thin film of molecular OSCM 20' which is finally obtained.

According to one variant of this method, the powder 20 can be melted separately and conveyed into the oven for example via an axial duct fitted to the mechanical pressing means and whose opening is controlled by a valve. The pressing means, as in an injection press or extruder, can then be a single- or twin-screw. In this case, and advantageously, the oven is previously brought to a temperature equal to the Mp to maintain the substrate 10 at this temperature so that the molecular OSCM in its molten state does not undergo heat shock on its arrival which may subsequently prevent the formation of high structural quality. This variant may be preferred since it allows better control over the quantity of molecular OSCM provided.

Figure 2A:
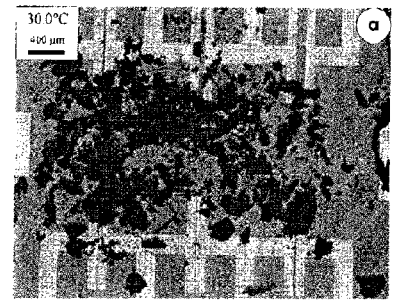
FIGS. 2A to 2N illustrate photos taken by cross-polarized optical thermo-microscopy (POTM) in reflection mode, of an OFET device when preparing a single-crystal thin film in rubrene according to the invention.
Figure 2B:
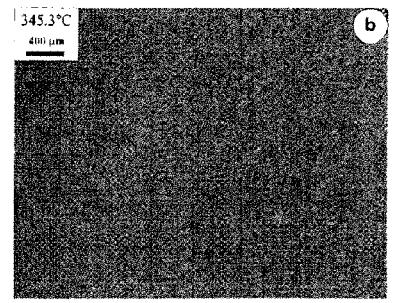
Figure 2C:
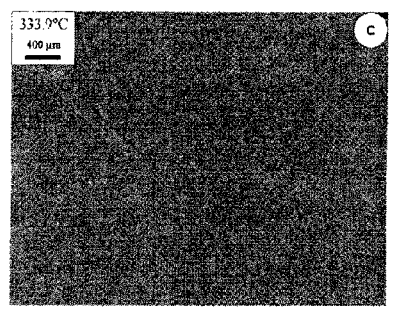
Figure 2D:
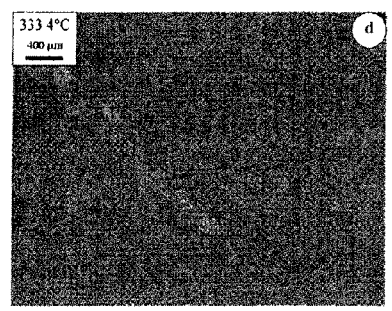
Figure 2E:
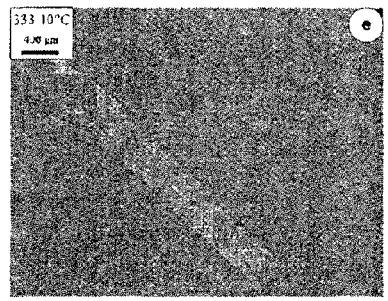
Figure 2F:
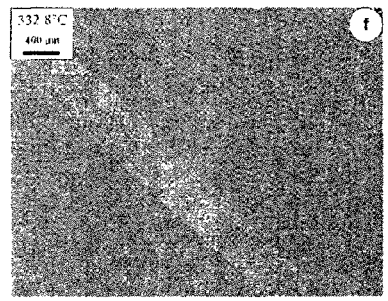
Figure 2G:
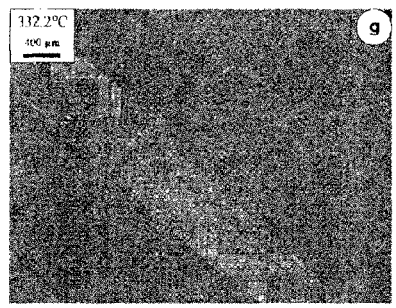
Figure 2H:
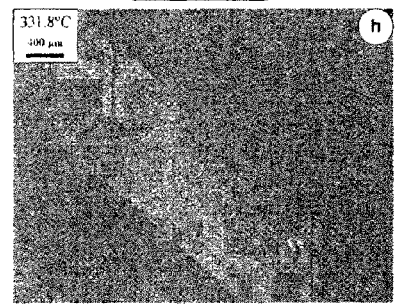
Figure 2I:
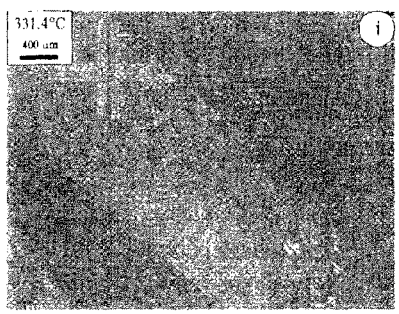
Figure 2J:
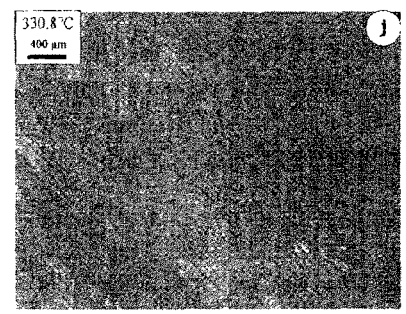
Figure 2K:
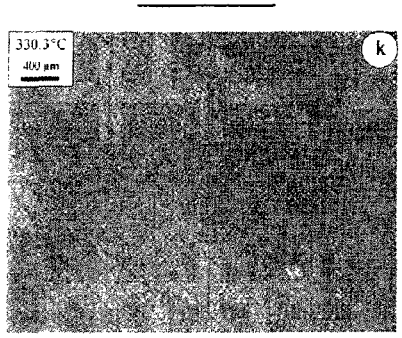
Figure 2L:
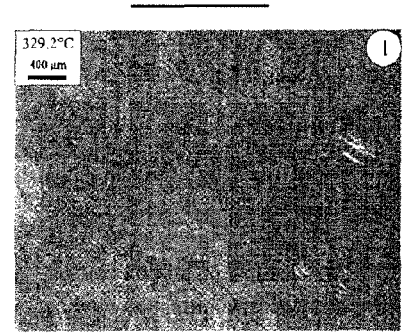
Figure 2M:
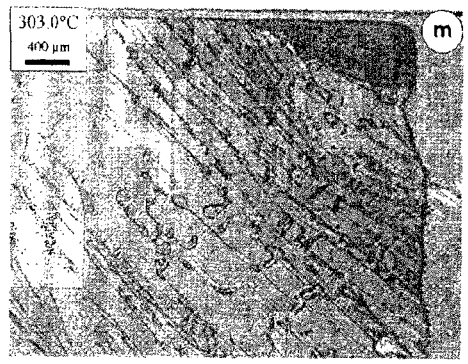
Figure 2N:
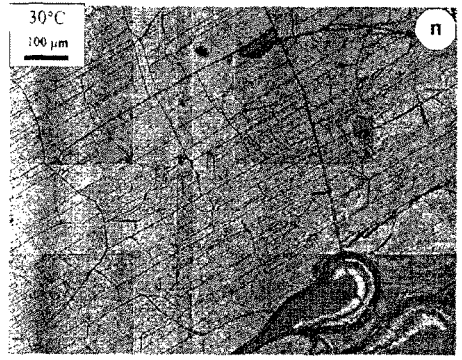

With reference to FIGS. 2A to 2N, photos taken by cross-polarized optical thermo-microscopy in reflection mode show different steps in the fabrication according to the invention of a single-crystal thin film 20 in rubrene (molecular OSCM of the oligo(acene) family on a pre-patterned substrate 10 for OFET.

FIG. 2A shows the powder on the substrate 20 at ambient temperature.

FIG. 2B shows that, at T=345.3° C., rubrene is in its molten state (Mp=334° C.). It can be seen here that the molten rubrene under POTM (cross polarized optical thermo-microscopy) is opaque in reflection mode, which means that the substrate 10 "disappears".

With reference to FIGS. 2C to 2L, the temperature is lowered from 345.3° C. to 329.2° C. at a rate of 5° C./min. In each photo (showing the structural state at different temperatures between these two limit values) single-crystals are seen to appear which grow over time and as temperature decreases without any need to add an additive to the pure molecular OSCM. It can be seen here that the single-crystal rubrene is bi-refractive during POTM observation in reflection mode, which means that the substrate 10 "reappears" through the thin film at the points where the single-crystal domains are formed. The inventors subsequently inferred, from the analysis in FIGS. 2B and 2C, that only one single-crystal seed appeared between the temperatures of 345.3° C. and 333.9° C. since a first single-crystal domain is seen in photo 2C.

With reference to FIGS. 2M to 2N, the temperature is brought down to ambient temperature (30° C.) at a rate of 5° C./min—FIG. 2M showing the state of the thin film 20 at 303° C. The single-crystal domains can be clearly seen in transparency (they are delimited by the dark lines in the thickness of the thin film).

With reference to FIG. 2N, an operational OFET is obtained containing an active single-crystal thin film in rubrene.

With reference to FIGS. 3A to 3F, photos taken under POTM in transmission mode show different steps in the fabrication according to the invention of a single-crystal thin film 20 in α-terthienyl (molecular OSCM of the oligo(thiophene) family) on a glass surface.

α-terthienyl is first brought to a temperature equal to its melting point (Mp=94° C.)

With reference to FIGS. 3A to 3E, the temperature is held at Mp. In each photo, (showing the structural state at different cooling stages) single-crystal domains are seen to appear (light parts, the dark parts consisting of the melt of α-terthienyl) which grow over time.

Figure 3A:
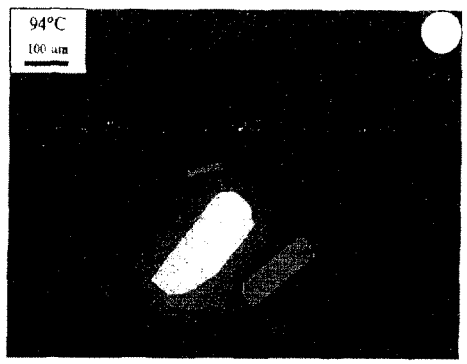
FIGS. 3A to 3G illustrate photos taken by POTM in transmission mode, of a glass surface carrying a single-crystal thin film in n-terthienyl according to the invention.
Figure 3B:
Figure 3C:
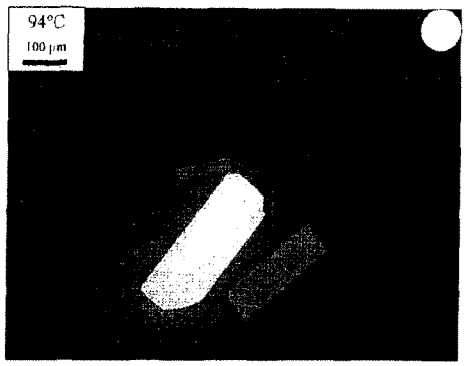
Figure 3D:
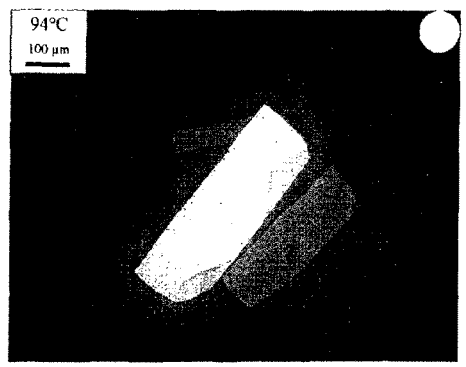
Figure 3E:
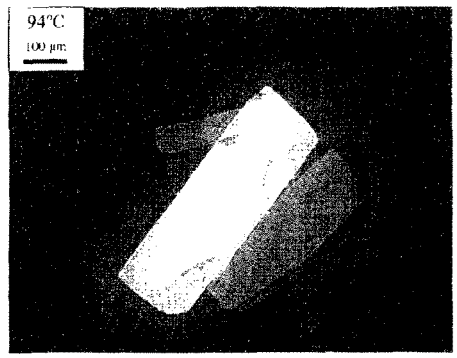
Figure 3F:
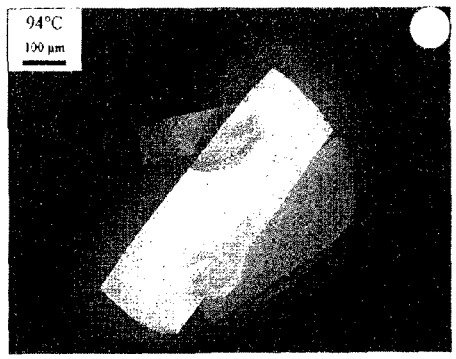
Figure 3G:
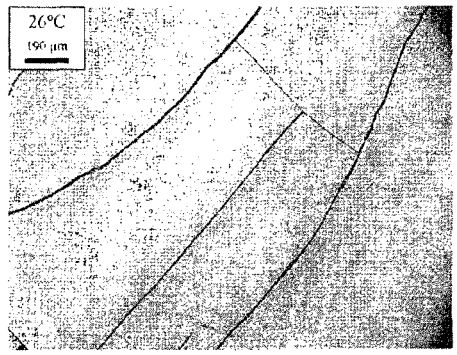

With reference to FIG. 3F, the temperature is brought down to ambient temperature (30° C.) at a rate of 2.5° C./min, and a single-crystal thin film is obtained in α-terthienyl-on-insulator (the insulator being the glass surface).

These POTM images were supplemented by X-ray Diffraction ("XRD") and Atomic Force Microscopy ("AFM") characterizations, which allowed:

confirmation of the single-crystal nature of the mesoscopic or macroscopic domains (XRD measurements); and determination of crystal orientation type relative to the substrate (AFM and XRD measurements).

Figure 4:
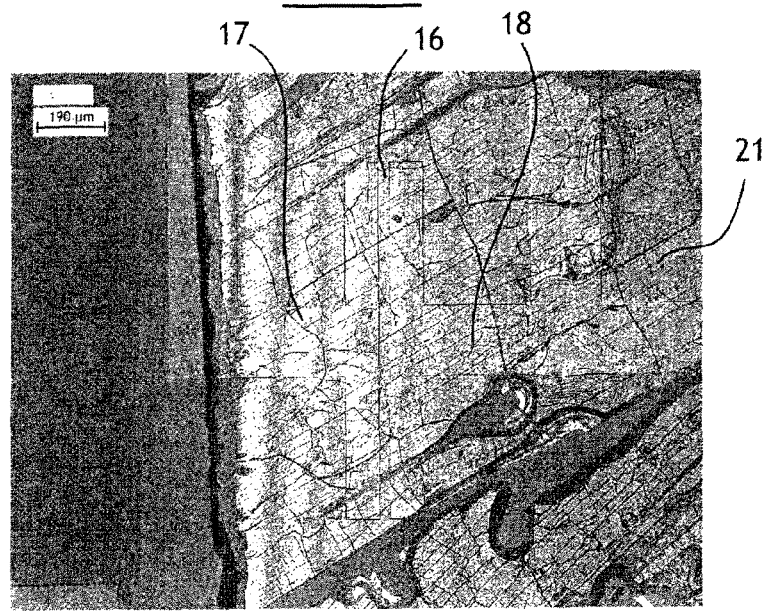
FIG. 4 shows a photo taken by POTM in reflection mode of an OFET having an active single-crystal layer in rubrene fabricated according to the invention.

Performance Levels of Organic Field Effect Transistors Fabricated According to the Invention:

FIG. 4 shows a POTM image of an OFET device having a gap 16 between the source 17 and the drain 18 of thirty microns in width and one thousand microns in length, coated with a gate oxide 100 nanometers thick, which is partly coated with single-crystal domains (straight part 21) in thin rubrene film all having a similar orientation and formed during initial growth of the single-crystal domains according to the invention.

On cooling, the single-crystal film split into smaller single-domains than initially, since the heat gradients between the substrate 10 and the organic layer 20 were still too high on cooling, and as a result the entirety of the gap 16 between the source 17 and the drain 18 is not covered.

Figure 5:
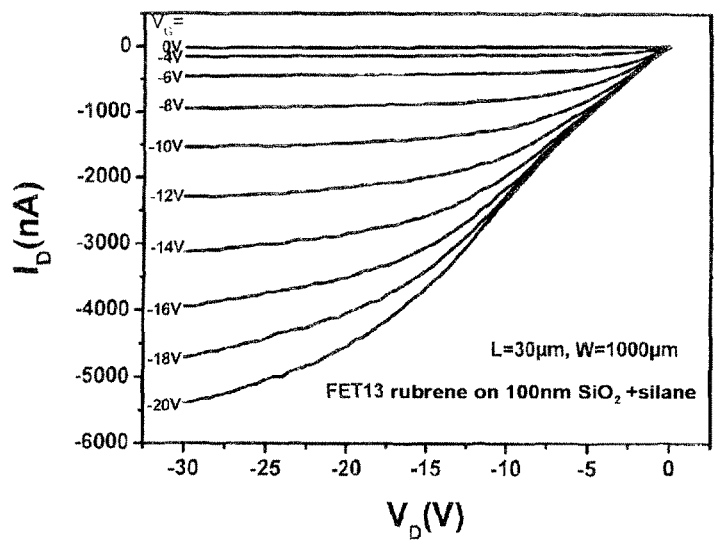
FIG. 5 illustrates the Drain Current characteristics ($I_D$ [nA])–Drain Voltage ($V_D$[V]) of the device of FIG. 4.

The electric characterizations obtained [characteristics "Drain Current ($I_D$ [nA])–Drain Voltage VD(V)" in FIG. 5; and "mobility of charge carriers (in saturation mode: $\mu_{sat}$ [$cm^2.V^{-1}.s^{-1}$]) for a Drain Voltage ($V_D$[V]) of –30 V in relation to the gate voltage $V_G$[V]" in FIG. 6] are therefore underestimated for this device.

Figure 6:
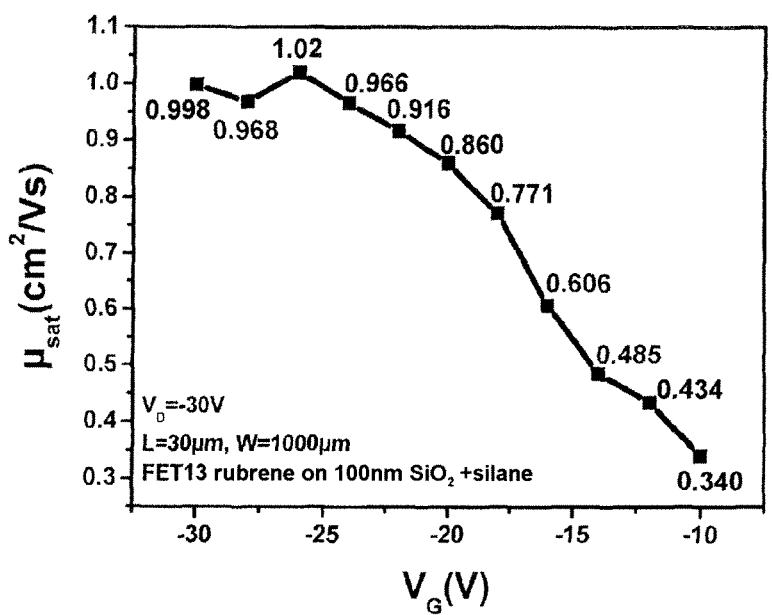
FIG. 6 illustrates the mobility of the charge carriers (in saturation mode: $\mu_{sat}$ [cm$^2$.V.$^{-1}$.s$^{-1}$]) for a Drain Voltage ($V_D$ [V]) of −30 V in relation to the voltage of the gate ($V_G$[V]) of the device according to FIG. 4.

The performance levels obtained, with reference to FIGS. 5 and 6, are very creditable however (e.g. equivalent to those of field effect transistors with active layers in amorphous silicon).

It is particularly noted (FIG. 5) that the device is active and conducting for relatively low gate voltages, having regard to the thickness of the gate oxide 100 nm).

The effective mobility (FIG. 6) calculated in saturation mode from the slope of the characteristics $I_D^{1/2}$ ($V_G$) (not shown) saturates close to values in the order of 1.0 $cm^2.V^{-1}.s^{-1}$ for gate voltages ($V_G$) in the order of 25 V.

This mobility value is notably high for a thin film OFET, despite the fact that the source-drain gap 16 is not fully covered.

The value found is therefore well below a value which would be obtained with a non-split OFET. By optimizing the growth of a single-crystal active layer of larger dimension, or by reducing the geometry of the electrodes, it can reasonably be envisaged to obtain mobility values ($\mu$) reaching levels in the order of a few tens of $cm^2.V^{-1}.s^{-1}$ for single-crystal thin films in rubrene.

This is particularly probable for configurations in which the source-drain electrodes cover a smaller surface, which is the case with devices for industrial applications of micro-electronic and nano-electronic type.

An organic field effect transistor (OFET), containing single-crystal rubrene thin films, fabricated according to the invention, therefore permits high electric performance levels to be reached.

These results are of all the more interesting as rubrene is a molecular OSCM which remains extremely difficult to obtain in highly organized, single-crystal thin films using conventional techniques, and it is a very attractive material—whilst being heat-stable and scarcely sensitive to oxygen contamination effects, and can attain record mobility values.

The inventors were also successfully able to obtain single-crystal thin films from several other molecular OSCMs such as α-terthienyl, α-sexithienyl and pyrene.

In addition, it is to be pointed out that the technique used to obtain a single-crystal thin film of molecular OSCM according to the invention is generic, in that it can be applied to any molecular OSCM that is congruent at its melting point.

Also, the implementation of the method according to the invention is technically simple, and the similarity with plastics conversion techniques offers prospects for the development of production lines at lower cost than conventional micro/nano-electronic production methods.

Additionally, with the technique according to the invention, it can be envisaged to coat large surfaces with thin films having a controlled extent of structural organization (this structural organization possibly reaching from the amorphous layer to the single-crystal layer) having recourse to a low-cost method in fact relating to the fabrication of organic electronic and opto-electronic devices using methods similar to those used in plastics conversion).

The invention claimed is:

1. A method of forming a thin film in molecular organic semiconductor material (OSCM) intended to be integrated in a device for electronic or opto-electronic applications, comprising the following steps:

(a) providing a determined quantity of molecular OSCM in the form of a melt on the surface of a carrier so as to form a thin film;

(b) cooling as per a determined temperature profile to cause solidification of the thin film;

wherein the temperature of the carrier surface is equal to or higher than the melting point of the molecular OSCM at the time step (a) is conducted, and wherein the temperature profile for step (b) comprises:
a first part corresponding to controlled, sufficiently slow cooling of the molecular OSCM down to a temperature close to the crystallization temperature of the molecular OSCM, so as only to cause one seed to appear in the thin film in melt form; and
a second part corresponding to controlled cooling so that at least one single-crystal domain grows from this seed, the thin film finally obtained being single crystalline.

2. The method of claim 1, being conducted in an inert atmosphere.

3. The method of claim 1, further comprising, before step (a), the providing of said material in solid form, and the heating of this material to a temperature higher than its melting point.

4. The method of claim 1, wherein step (h) comprises the application of pressure to the surface of the molten molecular OSCM for distribution thereof in a thin film over the surface of the carrier.

5. The method of claim 1, wherein step (a) comprises:
housing said carrier in a receptacle of an oven,
spreading the molten molecular OSCM over the carrier;
exerting a pressure on the molten molecular OSCM to distribute it in a thin film of uniform thickness over the surface of the carrier.

6. The method of claim 1, wherein the cooling is controlled during step (b) using temperature adjustment means in contact with the thin film, servo-controlled by an oven temperature regulating system.

7. The method of claim 1, wherein the molecular OSCM is chosen from the following family of molecular OSCMs:

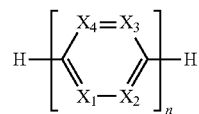

(3)

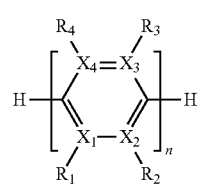

(4)

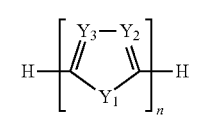

(5)

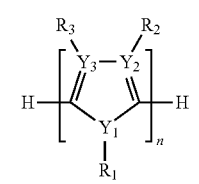

(6)

with n<20 and Mw<5,000 g.mol$^{-1}$
with a first pattern such as (3) and (4) in which $X_1=X_2=X_3=X_4=C$ defining for example biphenyl (n=2), terphenyl (n=3), quaterphenyl (n=4), quinquephenyl (n=5), sexiphenyl (n=6);

with a second pattern such as (5) and (6) in which $Y_1=S$, $Y_2=Y_3=C$ defining for example α-bisthienyl α-terthienyl (n=3), α-quaterthienyl (n=4), α-quinquethienyl=5), α-sexithienyl (n=6).

8. The method of claim 1, wherein the molecular OSCM is chosen from the following family of molecular OSCMs:

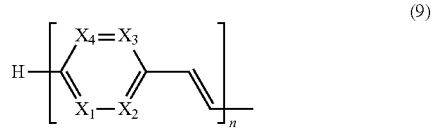

(9)

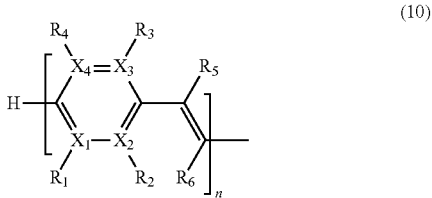

(10)

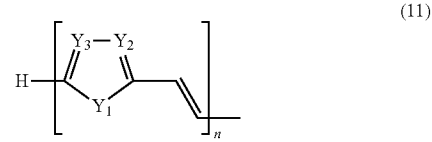

(11)

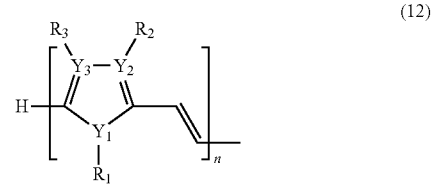

(12)

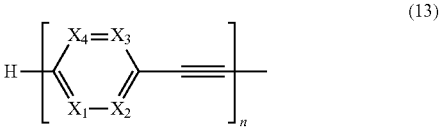

(13)

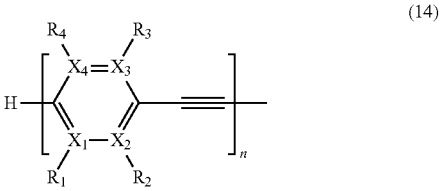

(14)

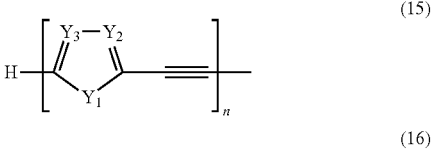

(15)

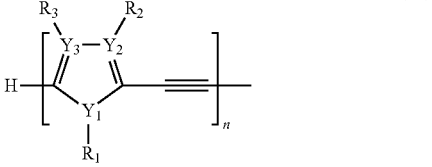

(16)

with n<20 and Mw<5,000 g.mol$^{-1}$
with a first pattern such as (9)-(10) and (13)-(14) in which $X_1=X_2=X_3=X_4=C$ defining for example oligo(1,4-phenylene-vinylene)s or oligo (1,4-phenylene-ethynylene)s in relation to the repeat n of the pattern;

with a second pattern such as (11)-(12) and (15)-(16) in which $Y_1$=S, $Y_2$=$Y_3$=C defining for example oligo (2,5(thienylene-vinylene))s and oligo(2,5-thienylene-ethynylene)s.

9. The method of claim 1, wherein the molecular OSCM is chosen from the following family of molecular OSCMs:

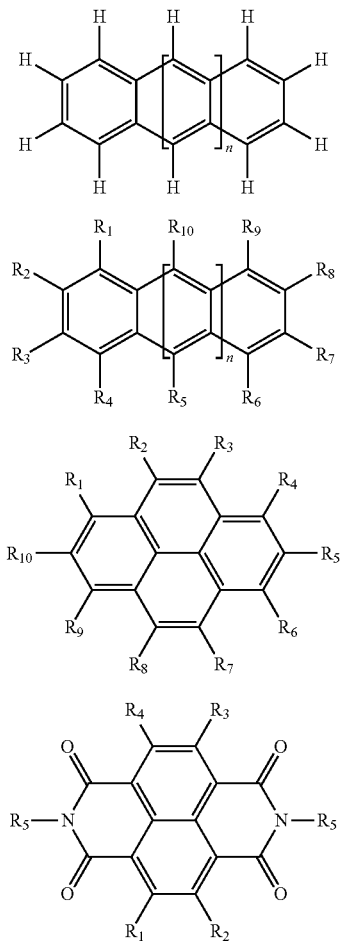

with a first pattern such as (17) defining for example naphthalene, anthracene, tetracene, pentacene or hexacene;
with a second pattern such as (18) in which $R_5$=$R_{10}$=phenyl defining for example 9,10-diphenylanthracene, 5,12-diphenylnaphtacene or 5,6,11,12-tetraphenylnaphtacene also called rubrene, in relation to the repeat n of the pattern;
with a third pattern such as (19) defining for example pyrene, 1,3,6,8-tetraphenylpyrene, 1,3,6,8-tetrathienylpyrene, chrysene, perylene, coronene, terrylene, ovalene, quaterrylene or $C_{60}$, $C_{70}$, $C_{76}$, $C_{78}$, $C_{84}$ fullerenes;
with a fourth pattern of type such as (20) defining for example the diimides of naphthalene-1,4,5,8-tetracarboxylic acid, diimides of anthracene-2,3,6,7-tetracarboxylic acid, diimides of perylene-3,4,9,10-tetracarboxylic acid.

10. The method of claim 1 wherein the molecular OSCM is chosen to comprise:
aryl groups, namely with the basic pattern M1 in which $X_1$=$X_2$=$X_3$=$X_4$=C; and or
heteroaryl groups containing the basic pattern M1 in which $X_1$, $X_2$, $X_3$ and $X_4$ are chosen from among C, O, S, N, P and B; and/or
groups of heterocyclic type containing the M2 basic pattern in which $Y_1$=O, or S, or N, or P, or B and in which $Y_2$ and $Y_3$ are chosen from among C, O, S, N, P and B;

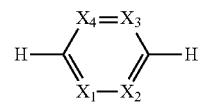

with X1, X2, X3 and X4 = C, or O, or S, or N, or P or B

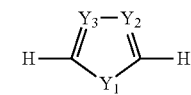

with Y1 = O, or S, or N, or P, or B with Y2 and Y3 = C, or O, or S, or N, or P, or B.

11. A method of forming an organic field effect transistor such as an OFET, comprising the following steps:
(a) providing a pre-patterned substrate, the pre-patterned substrate comprising a gate, a gate dielectric, source electrodes and drain electrodes;
(b) forming a thin film in single-crystal molecular OSCM conforming to the method according to any of claims 1 to 10, the pre-patterned substrate being said carrier and the thin film being the active layer of the transistor.

* * * * *

UNITED STATES PATENT AND TRADEMARK OFFICE
CERTIFICATE OF CORRECTION

PATENT NO.         : 8,758,508 B2                                      Page 1 of 1
APPLICATION NO.    : 12/739378
DATED              : June 24, 2014
INVENTOR(S)        : Patrice Rannou et al.

It is certified that error appears in the above-identified patent and that said Letters Patent is hereby corrected as shown below:

In the Claims

Column 19, Claim 4, line 19, please delete "(h)" and insert --(b)--.

Column 20, Claim 7, line 2, please delete "α-bisthienyl" and insert --α-bisthienyl (n = 2)--.

Column 20, Claim 7, line 4, please delete "α-quinquethienyl=5" and insert --α-quinquethienyl (n = 5)--.

Signed and Sealed this
Twenty-first Day of October, 2014

Michelle K. Lee
*Deputy Director of the United States Patent and Trademark Office*